United States Patent
Gu et al.

(10) Patent No.: US 7,195,992 B2
(45) Date of Patent: Mar. 27, 2007

(54) METHOD OF UNIFORM SEEDING TO CONTROL GRAIN AND DEFECT DENSITY OF CRYSTALLIZED SILICON FOR USE IN SUB-MICRON THIN FILM TRANSISTORS

(75) Inventors: Shuo Gu, San Antonio, TX (US); James M. Cleeves, Redwood City, CA (US)

(73) Assignee: Sandisk 3D LLC, Milpitas, CA (US)

( * ) Notice: Subject to any disclaimer, the term of this patent is extended or adjusted under 35 U.S.C. 154(b) by 108 days.

(21) Appl. No.: 10/681,509

(22) Filed: Oct. 7, 2003

(65) Prior Publication Data

US 2005/0072976 A1    Apr. 7, 2005

(51) Int. Cl.
*H01L 21/20* (2006.01)
*H01L 21/36* (2006.01)
(52) U.S. Cl. .......................................... 438/487; 257/66
(58) Field of Classification Search .................. 257/66; 438/471, 473, 488, 489, 166, 417, 486, 482, 438/487, 969
See application file for complete search history.

(56) References Cited

U.S. PATENT DOCUMENTS

| | | | |
|---|---|---|---|
| 5,457,058 A * | 10/1995 | Yonehara | 438/479 |
| 5,821,152 A | 10/1998 | Han et al. | |
| 5,923,968 A | 7/1999 | Yamazaki et al. | |
| 6,146,966 A | 11/2000 | Hirota et al. | |
| 6,204,156 B1 | 3/2001 | Ping | |
| 6,346,437 B1 | 2/2002 | Maekawa et al. | 438/166 |
| 6,383,899 B1 * | 5/2002 | Voutsas | 438/486 |
| 6,727,514 B2 * | 4/2004 | Park et al. | 257/20 |
| 6,881,994 B2 * | 4/2005 | Lee et al. | 257/296 |
| 2002/0028541 A1 | 3/2002 | Lee et al. | |
| 2004/0235276 A1 * | 11/2004 | Lin | 438/487 |

OTHER PUBLICATIONS

Banerjee, Aditi.,et al. ,"Fabrication and Performance of Selective HSG Storage Cells for 256 Mb and 1Gb DRAM Applications", *IEEE Transactions on Electron Devices*, vol. 47, No. 3, (Mar. 2000), 584-592.

Bo, Xiang-Zheng.,et al. ,"Spatially selective single-grain silicon films induced by hydrogen plasma seeding", *J. Vac. Sci. Technol. B* 20(3), (May/Jun. 2002).

(Continued)

*Primary Examiner*—Howard Weiss
(74) *Attorney, Agent, or Firm*—Vierra Magen Marcus & DeNiro LLP (57) ABSTRACT

A method to create a polysilicon layer with large grains and uniform grain density is described. A first amorphous silicon layer is formed. A crystallizing agent is selectively introduced in a substantially symmetric pattern, preferably symmetric in two dimensions, across an area of the first amorphous layer. The crystallizing agent may be, for example, silicon nuclei, germanium, or laser energy. A mask layer is formed on the amorphous silicon layer, and holes etched in the mask layer in a symmetric pattern to expose the amorphous layer to, for example, silicon nuclei or germanium) only in the holes. The mask layer is removed and a second amorphous layer formed on the first. If laser energy is used, no mask layer or second amorphous layer is generally used. The wafer is annealed to form a polysilicon layer with substantially no amorphous silicon remaining between the grains.

43 Claims, 5 Drawing Sheets

OTHER PUBLICATIONS

Dahlheimer, C..E., et al., "Laser-Interference Crystallization of Amorphous Silicon", 54-55.

Oh, Chang-Ho., et al., "A Proposed Single Grain-Boundry Thin-Film Transistor", *IEEE Electron Device Letters*, vol. 22, No. 1, (Jan. 2001),20-22.

Song, I.H., et al., "A New Multi-Channel Dual-Gate Poly-Si TFT Employing Excimer Laser Annealing Recrystallization on pre-patterned a-Si thin Film", 0-7803-7463-X02 (C) 2002 *IEEE*, (2002).

Subramanian, Vivek., et al., "Controlled Two-Step Solid-Phase Crystallization for High-Performance Polysilicon TFTs", *IEEE Electron Device Letters* vol. 18 Issue: 8, Aug. 1997, 378-381.

Yamauchi, N., et al., "Polycrystalline silicon thin films processed with silicon ion implantation and subsequent solid-phase crystallization: Theory, experiments, and thin-film transistor applications", *Journal of Applied Physics*, vol. 75, (1994),3235-3257.

\* cited by examiner

METHOD OF UNIFORM SEEDING TO CONTROL GRAIN AND DEFECT DENSITY OF CRYSTALLIZED SILICON FOR USE IN SUB-MICRON THIN FILM TRANSISTORS

BACKGROUND OF THE INVENTION

The invention relates to a method to enhance grain size in polycrystalline silicon, called polysilicon. Larger grain size in polysilicon is advantageous for many uses, particularly in thin film transistors (TFTs).

One of the major obstacles to the use of polysilicon thin film as a semiconductor in active devices is the relatively small grain sizes (around 0.05 micron or less) of polysilicon thin films deposited by such methods as low-pressure chemical vapor deposition and sputtering. A film with small grain size has a larger number of grain boundaries, decreasing carrier mobility. Typical electron mobilities in polysilicon films made using these methods are on the order of 10 $cm^2$/volt-second, two orders of magnitude lower than electron mobilities in bulk silicon.

The poor electrical performance caused by grain boundaries in the channel region limits the use of TFTs largely to low-temperature flat panel displays. It is believed that electrical properties of TFTs can be improved if the grain size is enhanced and the number of grain boundaries in the channel region minimized.

It is known to seed amorphous silicon with a crystallizing agent to induce crystallization, followed by an anneal to increase grain size. For example, Gu, U.S. patent application Ser. No. 10/391,142, "Large Grain Size Polysilicon Films Formed by Nuclei-Induced Solid Phase Crystallization," filed Mar. 17, 2003, hereby incorporated by reference, uses silicon nuclei as a crystallizing agent. This is a method to produce large grains by seeding. A first amorphous silicon layer is formed. Silicon nuclei are deposited, and crystallization is prevented until a second amorphous silicon layer is formed. The wafer is then annealed to form a polysilicon layer. As described in Gu, this method prevents hemispherical grain formation, producing a layer of large-grained silicon grains particularly advantageous for formation of TFT transistor channels.

In the method of Gu, however, placement of the silicon nuclei is not controlled. A grain grows from each nucleus. While overall grain size is increased with this method, in specific locations, if two or more silicon nuclei happen to be deposited very close to each other, there may be a higher concentration of grain boundaries relative to other areas. Similarly, if other areas see a lower-than average distribution of silicon nuclei, those areas may require a long anneal time to ensure that no amorphous silicon remains between grains. The difference in local nucleus densities is one cause of non-uniformity of thin film transistors across a wafer in production. Minimizing the difference in local nucleus densities across a wafer will improve the uniformity of thin film transistors built on such a wafer and achieve a better production yield.

Oh et al., "A Proposed Single Grain-Boundary Thin-Film Transistor," IEEE Electronic Device Letters, Vol. 22, No. 1, January 2001, attempt to control the number of grain boundaries in a transistor channel by providing two nucleation sites for each transistor, one where the source will be formed and one where the drain will be formed. An anneal causes a grain to grow from each nucleation site, until the two grains abut, thus guaranteeing that there will be exactly one grain boundary in the channel.

Placement of seeds at source and drain for every transistor according to Oh et al., while practicable for a single transistor or a small number of transistors, becomes expensive and cumbersome for an array of transistors, particularly when device size is small. In production this method could become prohibitively expensive due to circuit layout and mask layout changes required for different products and design modifications.

There is a need, therefore, for a low-cost, practical method to enhance grain size and grain uniformity in polysilicon thin films.

SUMMARY OF THE INVENTION

The present invention is defined by the following claims, and nothing in this section should be taken as a limitation on those claims. In general, the invention is directed to form a large-grained polysilicon layer with controlled grain and defect density.

A first aspect of the invention provides for a semiconductor die comprising a first crystallized silicon layer, said first crystallized silicon layer comprising a first area bounded by four adjacent nucleation sites, said first area having no more than five crystal grain boundaries and said first area having no amorphous silicon.

An aspect of the invention provides for a method for crystallizing a polysilicon layer on a wafer, the method comprising forming a first amorphous silicon layer; selectively introducing a crystallizing agent on the amorphous layer in a substantially symmetric pattern in two dimensions; and annealing the wafer to form the crystallized polysilicon layer, wherein substantially no amorphous silicon remains between silicon grains in the polysilicon layer.

Another aspect of the invention provides for a method for producing a wafer having a crystallized silicon layer with controlled defect density, the method comprising forming a first layer of amorphous silicon on the wafer; selectively introducing a crystallizing agent on the amorphous silicon layer in a substantially symmetric pattern across a seeded area; and annealing the amorphous silicon layer, wherein, after the annealing step, in the seeded area, the area bounded by adjacent nucleation sites encloses no more than five crystal grain boundaries.

Still another aspect of the invention provides for method for controlling grain uniformity on a wafer, the method comprising forming a first layer of amorphous silicon on the wafer; selectively introducing a crystallizing agent at substantially uniform intervals across an area of the amorphous silicon layer; forming a second layer of amorphous silicon on and in contact with at least portions of the first layer of amorphous silicon; and annealing the wafer to convert the amorphous silicon layers to a polysilicon layer.

Yet another aspect of the invention provides for a method for maximizing grain size and controlling density of grain boundaries in crystallized silicon, the method comprising forming a first amorphous silicon layer on a wafer; selectively creating nucleation sites at substantially uniform intervals on the first amorphous silicon layer; annealing the wafer to convert the amorphous layer to polysilicon; and forming a plurality of memory cells in the polysilicon, wherein portions of the cells comprise portions of the polysilicon, and wherein placement of the nucleation sites and placement of individual memory cells is not coordinated.

A separate aspect of the invention provides for a method for maximizing grain size and controlling density of grain boundaries in silicon, the method comprising forming a first amorphous silicon layer on a wafer; selectively creating nucleation sites at uniform intervals on the amorphous silicon layer; annealing the wafer to form polysilicon wherein substantially no amorphous silicon remains between silicon grains; and forming a plurality of active devices, the devices at least partially formed in the polysilicon.

A preferred embodiment of the invention provides for a method for controlling grain boundaries in a polysilicon layer, the method comprising forming a first amorphous silicon layer on a wafer; forming a mask layer having holes at substantially uniform intervals on and in contact with the first amorphous silicon layer wherein the amorphous silicon layer is exposed in the holes; depositing a crystallizing agent on the mask layer and on the first amorphous silicon layer; forming a second amorphous silicon layer in contact with at least portions of the first amorphous silicon layer, and annealing the wafer.

Another preferred embodiment provides for a method for controlling grain density in crystallized silicon, the method comprising forming an amorphous silicon layer on a wafer; exposing the amorphous silicon layer to laser energy to create symmetrically distributed nucleation sites; and annealing the wafer, wherein substantially no amorphous silicon remains between silicon grains after the annealing step is complete.

An embodiment of the invention provides for a monolithic three dimensional memory array comprising memory cells comprising polysilicon formed by a method comprising forming a first amorphous silicon layer on a wafer; selectively introducing a crystallizing agent at nucleation sites at substantially uniform intervals on the first amorphous silicon layer; annealing the wafer to grow silicon grains; and forming the memory array, wherein the memory array comprises at least two levels of memory cells, one level formed vertically above another, and wherein, after formation of the memory array, substantially no amorphous silicon remains between the grains.

An aspect of the invention provides for a method for producing a wafer having a crystallized silicon layer with controlled defect density, the method comprising forming a first layer of amorphous silicon on the wafer; selectively introducing a crystallizing agent on the amorphous silicon layer in a substantially symmetric pattern across a seeded area, the seeded area having a first distance between nucleation sites; and annealing the amorphous silicon layer, wherein, after the annealing step, in the seeded area, a chance that a square area having a side less than about one fourth of the first distance has no more than one grain boundary is greater than about 0.75.

Yet another aspect of the invention provides for a method for controlling grain boundaries in a polysilicon layer, the method comprising forming a first amorphous silicon layer on a wafer; forming a mask layer on and in contact with the first amorphous silicon layer; etching the mask layer wherein portions of the amorphous silicon layer are exposed; depositing silicon nuclei on the mask layer and on the first amorphous silicon layer; forming a second amorphous silicon layer in contact with at least portions of the first amorphous silicon layer, and annealing the wafer.

Each of the aspects and embodiments of the invention can be used alone or in combination with one another.

The preferred aspects and embodiments will now be described with reference to the attached drawings.

DETAILED DESCRIPTION OF THE INVENTION

In general, the present invention is directed to a method to minimize the density of grain boundaries in crystallized silicon and maximize uniformity.

As noted, the prior art methods of seeding amorphous silicon to create large grain polysilicon films suffer from disadvantages: lack of uniformity, or the need to coordinate device location and seeding location.

The present invention addresses this challenge in applications in which not only maximum grain size but also uniformity of grain density is desirable. In general the present invention provides for forming an amorphous silicon layer. A crystallizing agent is provided at uniform intervals, in a symmetric pattern, across some area of the amorphous silicon layer. In some, but not all, aspects of the invention, a second amorphous silicon layer will be formed on the first layer. The wafer is then annealed to convert the amorphous silicon layer or layers to a polycrystalline layer. Because the grains grow from uniformly distributed nucleation sites, the resulting density of grains and of grain boundaries is predictable over a relatively large area, for example over all, most or some portion of a wafer surface. As the grain density is predictable and symmetric over the entire area, device locations and seed locations need not be coordinated.

Note that grain boundaries only exist between two grains. The front between a grain and the surrounding amorphous silicon matrix is not a grain boundary.

Figure 1A:
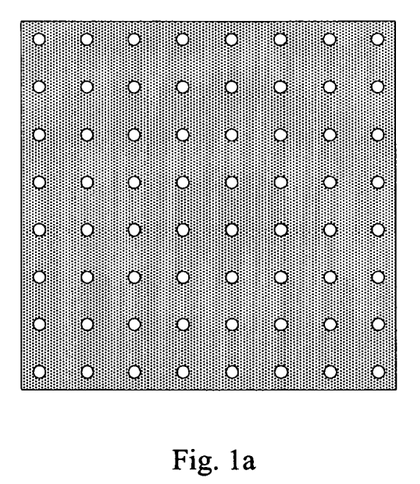
FIGS. 1a, 1b, and 1c are plan views of patterns which are symmetric in two dimensions.
Figure 1B:
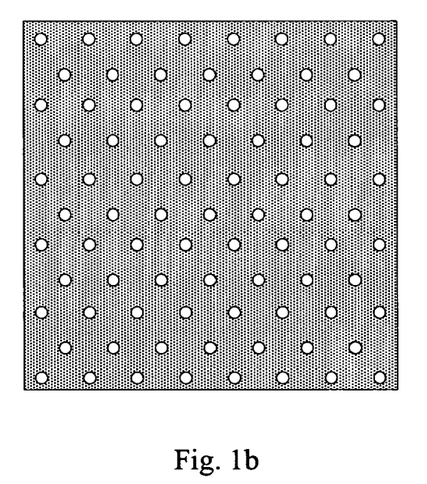
Figure 1C:
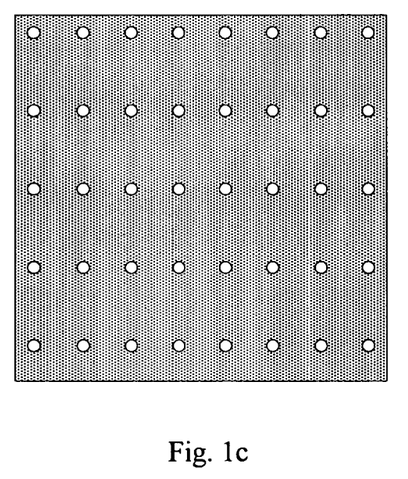

The seeding pattern is preferably substantially symmetric in two dimensions; meaning that nucleation sites, sites from which silicon grains grow, are substantially equally spaced in the plane of the surface of the amorphous silicon layer. In preferred embodiments, each nucleation site is substantially equally spaced from all of its closest neighbors. Parallel stripes, for example, are only symmetric in one dimension. Examples of patterns that are substantially symmetric in two dimensions are shown in FIG. 1a, FIGS. 1b, and 1c. In less preferred embodiments, one spacing is used in one direction, and a different spacing in another direction; such an arrangement is still considered to be substantially symmetric in two dimensions.

Various crystallizing agents can be used, including silicon nuclei, germanium, and laser energy, among others.

Examples will be given for how to practice the invention using silicon nuclei, germanium, and laser energy as the crystallizing agent. It will be apparent to those skilled in the art, however, that other crystallizing agents could be used.

These detailed examples will include specific process information, including temperature, pressure, times, dimensions, materials, etc.; this information is included for completeness and clarity only, and those skilled in the art will appreciate that these details may be varied and steps or materials may be added or omitted while still falling within the scope of the invention.

First Embodiment: Silicon Nuclei as Crystallizing Agent

A preferred embodiment which calls for selectively introducing silicon nuclei in a substantially symmetric pattern, where the silicon nuclei behave as a crystallizing agent, will be described in detail.

Figure 2A:
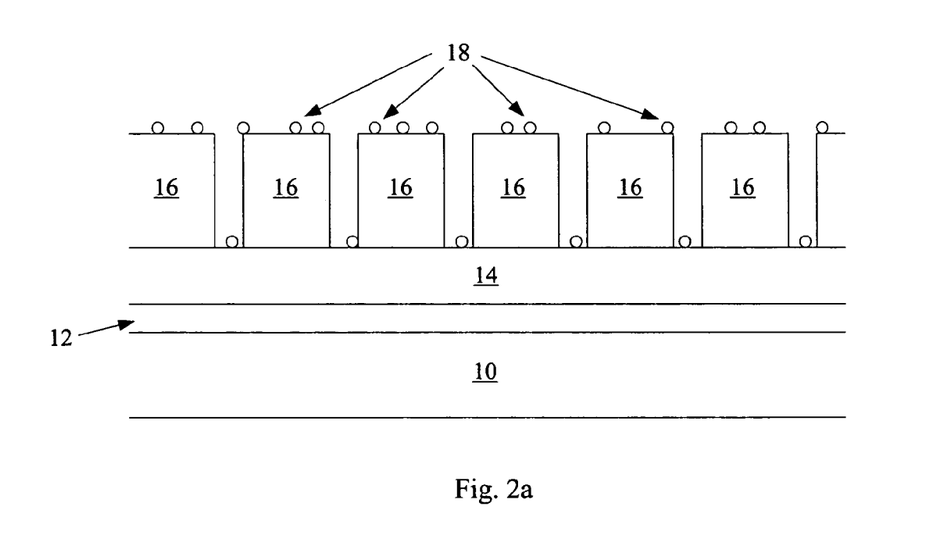
FIG. 2a is a cross-section showing a stage of formation of a polysilicon layer according to an embodiment of the present invention.

Deposition of amorphous silicon begins with any suitable substrate. Turning to FIG. 2a, in this example the substrate 10 can be any dielectric or any semiconductive material, such as, for example, a bulk silicon wafer. CMOS or other circuits may be formed in the substrate. A dielectric layer 12 may overlie the substrate 10. Clearly other substrates may be used, and dielectric layer 12 may or may not be present, as may other additional layers.

Amorphous silicon layer 14, as shown in FIG. 2a, can be deposited by low pressure chemical vapor deposition (LPCVD) or any other method known in the art. Amorphous layer 14 is about 50 to about 1500 angstroms thick, preferably about 500 to about 1000 angstroms thick, more preferably about 500 angstroms thick. Any conditions that will create an amorphous film can be used; for example, deposition can take place at a temperature ranging from about 460 to about 550 degrees Celsius, preferably 490 to 510 degrees. Pressure can vary widely and can be any pressure known in the art for successful formation of amorphous silicon, preferably between about 200 mTorr and atmospheric pressure. At higher temperatures, closer to 550 degrees, deposition will proceed faster, improving throughput, but the likelihood of unwanted formation of silicon nuclei increases. Higher pressure, for example about 1 Torr, may be used in conjunction with higher temperature to inhibit formation of nuclei. One advantageous combination of temperature and pressure is, for example, about 500 degrees C. and about 700 mTorr. The skilled practitioner will balance the need for increased throughput with the need to inhibit formation of nuclei and choose temperature and pressure accordingly. Any known source gas can be used, for example $SiH_4$ or $Si_2H_6$. Any appropriate commercial or other system can be used, for example an ASML RVP-300 LPCVD system.

Next mask layer 16 is deposited on amorphous layer 14. The thickness of mask layer 16 is not critical; it is preferably about 1000 to 3000 angstroms. In a preferred embodiment, 2000 angstroms of silicon dioxide is deposited by LPCVD. Many other materials can be used for mask layer 16; preferred materials have good etch selectivity with silicon and can be removed without damaging silicon layer 14. Mask layer 16 is patterned and etched using any conventional method to form symmetrically distributed holes in mask layer 16, the holes exposing portions of first amorphous silicon layer 14.

Any spacing of holes can be chosen as appropriate for the desired use, intended anneal time and temperature, etc. In a preferred embodiment, the holes are arranged in substantially a grid pattern, are about 0.5 micron in diameter or less, preferably about 0.5 micron in diameter, with between about 0.5 to about 3 microns between centers of adjacent holes, preferably about 2 microns. Preferred hole shapes are circles (each circle having a diameter of about 0.5 micron) or squares (each square having edges of about 0.5 micron), though any shape can be used. The hole size and shape should be selected such that the grain grows substantially outward from an approximate center. When selecting hole spacing, those skilled in the art will consider that closer spacing of holes clearly lead to higher density of nucleation sites, and thus faster completion of crystallization, which gives the advantage of faster, less costly processing. Sparser holes, on the other hand, means fewer nucleation sites and slower completion of crystallization, but results in larger grains. After the etch, the photoresist should be removed using any conventional method.

In an advantageous arrangement, the distance between mask holes in a grid pattern is substantially the same in the X- and in the Y-direction, improving predictability of location and number of grain boundaries. If holes are closer in X than in Y, for example, as the grains grow, they will meet in the X-direction sooner than in the Y-direction, causing some unpredictability in formation of boundaries as grains continue to grow toward each other in the Y-direction. Spacing with different distances between holes in the X and Y directions, as in FIG. 1c, falls within the scope of the present invention, but is not preferred.

The wafer is moved to a chamber for deposition of silicon nuclei, such as an LPCVD chamber. Once the temperature is stabilized to the desired level for deposition of silicon nuclei, preferably between about 550 and about 590 degrees, more preferably between about 570 and about 580 degrees, silicon nuclei 18 are deposited on amorphous layer 14 and mask layer 16, as shown in FIG. 2a. Deposition of silicon nuclei can be accomplished by any process known in the art. Higher pressure inhibits formation of nuclei, so if deposition of nuclei is performed at lower temperatures, near 550 degrees, pressure should not be too high, as is well known in the art. Advantageous pressures are less than 200 mTorr. Any appropriate source gas can be used for the nuclei, including $SiH_4$ or $Si_2H_6$. Advantageous conditions for deposition of silicon nuclei include flowing $SiH_4$ at a temperature of about 570 to about 580 degrees Celsius and a pressure of about 45 mTorr.

The silicon nuclei, also sometimes referred to in the art as crystallites, grains, or seeds, are single crystals of silicon which will serve as nuclei for the silicon grains of enhanced size to be grown during the anneal step to come. The size of these nuclei is the size required to achieve this purpose. If the silicon nuclei are too small, they may not grow during anneal. If they are too large, they will tend to be polycrystalline, rather than single crystal, increasing the number of grains in the finished product and thus decreasing average grain size. For the purposes of the present invention, the silicon nuclei deposited should be between about 0.05 micron and about 0.1 micron in diameter. Clearly the size of the silicon nuclei should be smaller than the size of the holes in mask layer 16. Inevitably, some small number of these silicon nuclei may not be single crystal, but this fraction should be kept to a minimum, preferably about 20 percent or less.

Advantageous conditions include, for example, depositing silicon nuclei from $SiH_4$ for one minute at about 45 mTorr with a temperature between about 550 to about 590 degrees Celsius, preferably about 570 to about 580 degrees Celsius.

For relatively smaller mask hole sizes, it is expected that it would be advantageous to use lower pressure (within the range given) during deposition. Lower pressure means silicon molecules are less likely to collide with another molecule, and thus more likely to successfully reach the surface of silicon layer 14 at the bottom of a hole.

As in Gu, once deposition of silicon nuclei is complete, temperature is preferably quickly lowered and pressure quickly increased to prevent conversion of first amorphous layer 14 to hemispherical grains. The temperature should be lowered as quickly as possible below about 550 degrees Celsius, preferably to about 500 degrees Celsius.

$SiH_4$ flow is stopped, and the chamber is backfilled with nitrogen to atmospheric pressure. The wafer will be removed from the chamber for the next step. The rapid increase of pressure will prevent hemispherical grain formation at this stage, as described in Gu. Other steps, such as decreasing temperature and increasing pressure, can be used to prevent hemispherical grain formation, as described in Gu.

Figure 2B:
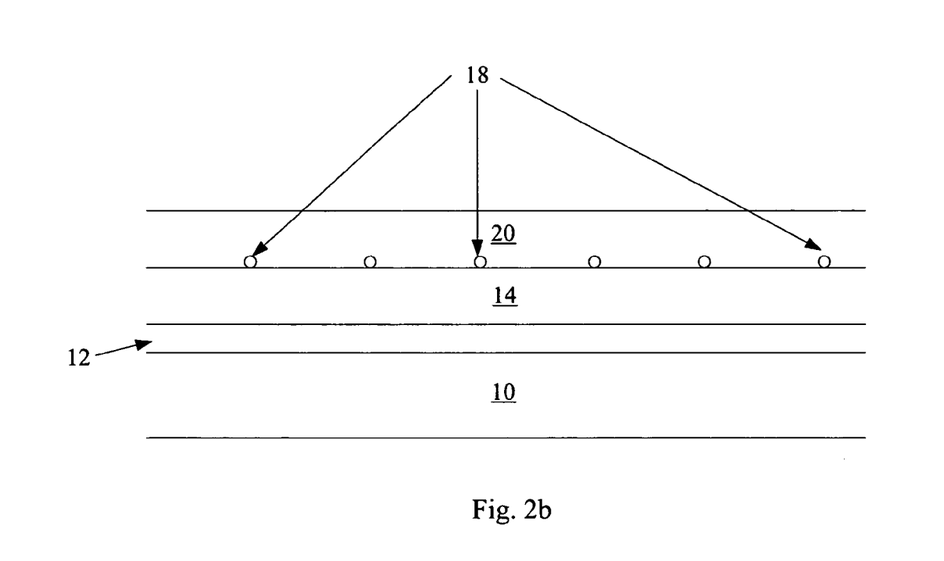
FIG. 2b is a cross-section showing a different stage of formation of a polysilicon layer according to an embodiment of the present invention.

Next, as shown in FIG. 2b, mask layer 16 is preferably removed. If it was formed of silicon dioxide, for example, it can be removed using a hydroflouride chemical etch. A mask layer 16 of silicon nitride, for example, could be removed used using phosphoric acid at about 170 degrees C. Advantageous materials for mask layer 16 will be easy to remove without damaging amorphous silicon layer 14. Silicon nuclei 18 that did not reach amorphous layer 14 and adhered to mask layer 16 will be removed with mask layer 16. Silicon nuclei 18 that reached the portions of amorphous layer 14 that were exposed in holes will remain.

It is preferred to next deposit a second amorphous silicon layer 20 on and in contact with the first amorphous layer and the silicon nuclei. This layer can be formed using the same techniques described for deposition of first amorphous silicon layer 14. The range of thicknesses for second amorphous layer 20 is the same as for first amorphous layer 14, except the combined thickness should preferably be about 2000 angstroms thick or less. In a preferred embodiment, each amorphous layer, 14 and 20, is about 500 angstroms thick.

After deposition of amorphous layer 20 is complete, the substrate and silicon layers with embedded nuclei should be annealed to induce growth of grains. The anneal should be performed preferably in nitrogen (though other inert gases may be used) at a temperature between about 500 and about 600 degrees Celsius, preferably about 540 degrees Celsius. At higher temperature, grain growth will proceed more quickly, but the higher temperature may trigger bulk nucleation such that the amorphous silicon itself will nucleate, rather than grains growing only from the deposited nuclei. At lower temperature such bulk nucleation is less likely, but crystallization takes longer to complete. The silicon should crystallize completely to guarantee good device performance. The skilled practitioner will balance these factors and select anneal temperature accordingly.

Second Embodiment: Germanium as Crystallizing Agent

In some embodiments, germanium is used as a crystallizing agent instead of silicon nuclei. A detailed example will be given, though conditions can be varied and steps can be added or omitted while the method and its results remain within the scope of the invention.

Figure 3:
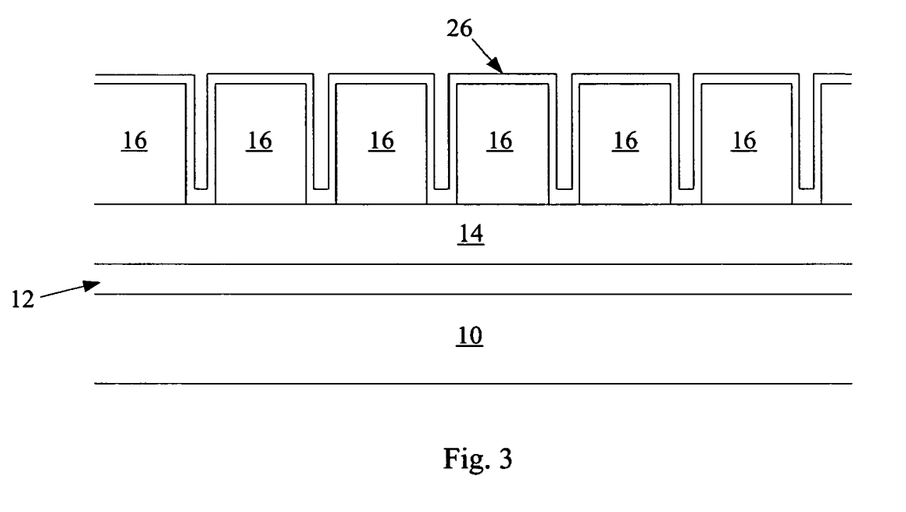
FIG. 3 is a cross-section showing a stage of formation of a polysilicon layer according to an embodiment of the present invention.

Turning to FIG. 3, formation of the first amorphous layer 14 over dielectric 12 and, for example, substrate 10, followed by formation, pattern, and etch of holes in mask layer 16 can be done using the same techniques and materials as those described in the previous embodiment, in which the crystallizing agent was silicon nuclei.

Next a layer of germanium 26 is deposited by any conventional method, for example by LPCVD, for example using $GeH_4$ as a source gas, with temperature of about 500 C at 100 mTorr. Germanium layer 26 is preferably between about 50 and about 200 angstroms thick, more preferably about 100 angstroms thick.

Under these conditions the deposition of germanium is inherently selective and is deposited on silicon layer 14 only. Mask layer 16 is then removed, and the method continues with deposition of a second amorphous layer 20 and anneal as in the previous embodiment, in which the crystallizing agent was silicon nuclei. The same materials and techniques can be used.

Deposition of second amorphous layer 20 after mask layer 16 is removed and before the wafer is annealed is preferred when using either silicon nuclei or germanium as a crystallizing agent. When silicon nuclei is the crystallizing agent, second amorphous layer 20 assures that crystallization takes place from silicon atoms in the bulk of silicon layers 14 and 20, not from the highly mobile surface, and helps prevent hemispherical grain formation, as in Gu. When germanium is the crystallizing agent, second amorphous layer 20 acts as a capping layer to help prevent germanium contamination in the channel.

While this method limits metal contamination, some difference in device performance may be observed when, for example, active regions of a transistor are formed near buried germanium regions.

Third Embodiment: Laser Energy as Crystallizing Agent

The crystallizing agent can be laser energy. As in the two previous embodiments, an amorphous silicon layer, for example formed over a dielectric layer and a wafer substrate, is formed using the methods described earlier. This embodiment calls for treating the first amorphous layer with a laser at locations distributed in a substantially symmetric pattern.

The wafer can be mounted on an x-y linear stage. The wafer surface can be illuminated at substantially uniform intervals. At each point at which the wafer is exposed to laser energy, the amorphous layer is transformed into a large single grain which can grow further upon annealing. The width of the laser and the exposure intervals can be chosen to produce the desired pattern; for example an area 0.5 micron wide can be exposed, with centers of the exposed areas 2 microns apart in a grid pattern.

The amorphous silicon layer can be irradiated with pulsed (10–100 nsec) XeCl excimer laser (308 nanometers) at an energy level of 300 millijoule per $cm^2$. Alternatively, more than one laser beam can be intersected to create an interference pattern at the surface of the amorphous silicon layer.

Bo et al., "Spatially selective single-grain silicon films induced by hydrogen plasma seeding," J. Vac. Sci. Technol. B 20(3), May/June 2002, describe depositing a mask layer on a layer of amorphous silicon, forming holes in the mask layer, and creating nucleation sites on the amorphous silicon exposed in the holes using a hydrogen plasma treatment. Bo et al. explore the feasibility of creating single-grain islands within an amorphous matrix using hydrogen plasma. An individual TFT device, Bo et al. suggest, can then be formed within each grain island.

The present invention differs from Bo et al. and Oh et al. in that in the present invention, an area of a wafer, or an entire wafer, is seeded at uniform intervals in two dimensions, without regard to layout of the circuitry. The wafer is then annealed to crystallize the entire seeded area, such that within the seeded area, substantially no amorphous silicon remains between silicon grains after the anneal is complete. Devices can be fabricated anywhere within the seeded and crystallized area.

Figure 4A:
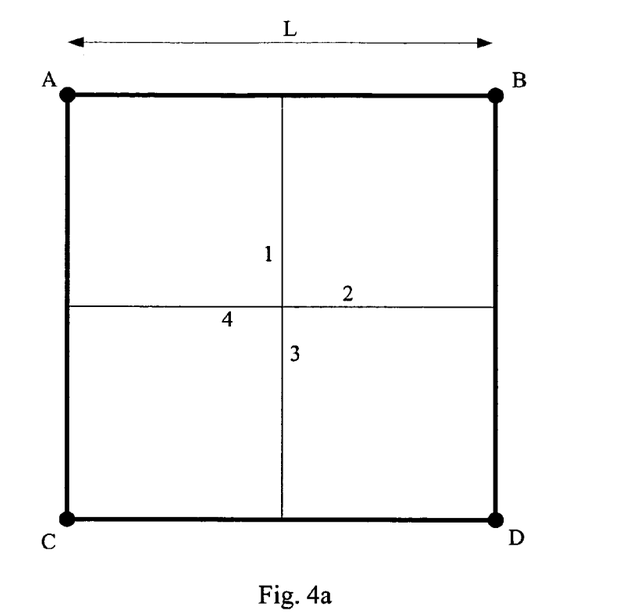
FIGS. 4a and 4b are plan view representations of grain boundaries in a polysilicon film formed according to the present invention.

A seeded area can be formed using the preferred hole size of 0.5 micron, the holes arranged in a grid pattern, with preferred spacing between the centers of adjacent holes of about 2 micron. In the seeded area, which is preferably some portion of the area of a wafer or of each die (though the area may not be contiguous), the area bounded by adjacent nucleation sites typically will not enclose more than five crystal grain boundaries. Turning to FIG. 4a, in an ideal situation, the boundaries of grains growing from nucleation sites A, B, C, and D arranged as the four corners of a square will meet in the precise center of the square. Symmetric placement of nucleation sites in two dimensions will inhibit the onset of bulk nucleation from within the amorphous silicon between grains. Thus within the area bounded by adjacent nucleation sites (A, B, C, and D), there will be four grain boundaries (a grain boundary separates two grains), numbered 1, 2, 3, and 4 in FIG. 4a. In this case there will be boundaries only between grain A and B, between grains A and C, between grains C and D, and between grains B and D. This will happen when grains A, B, C and D are perfectly spaced and grow at exactly the same rate.

Figure 4B:
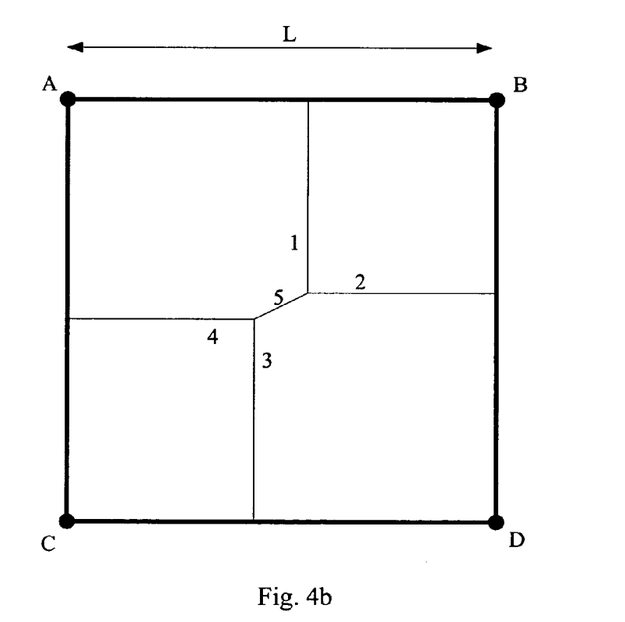

More often, however, grains will not meet exactly in the center. As in FIG. 4b, a fifth grain boundary (numbered 5) may form between grains A and D, as shown, or, alternatively, between grains B and C. The placement of the grain centers, however, means that typically there will be no more than five grain boundaries within the area bounded by adjacent nucleation sites.

Figure 5:
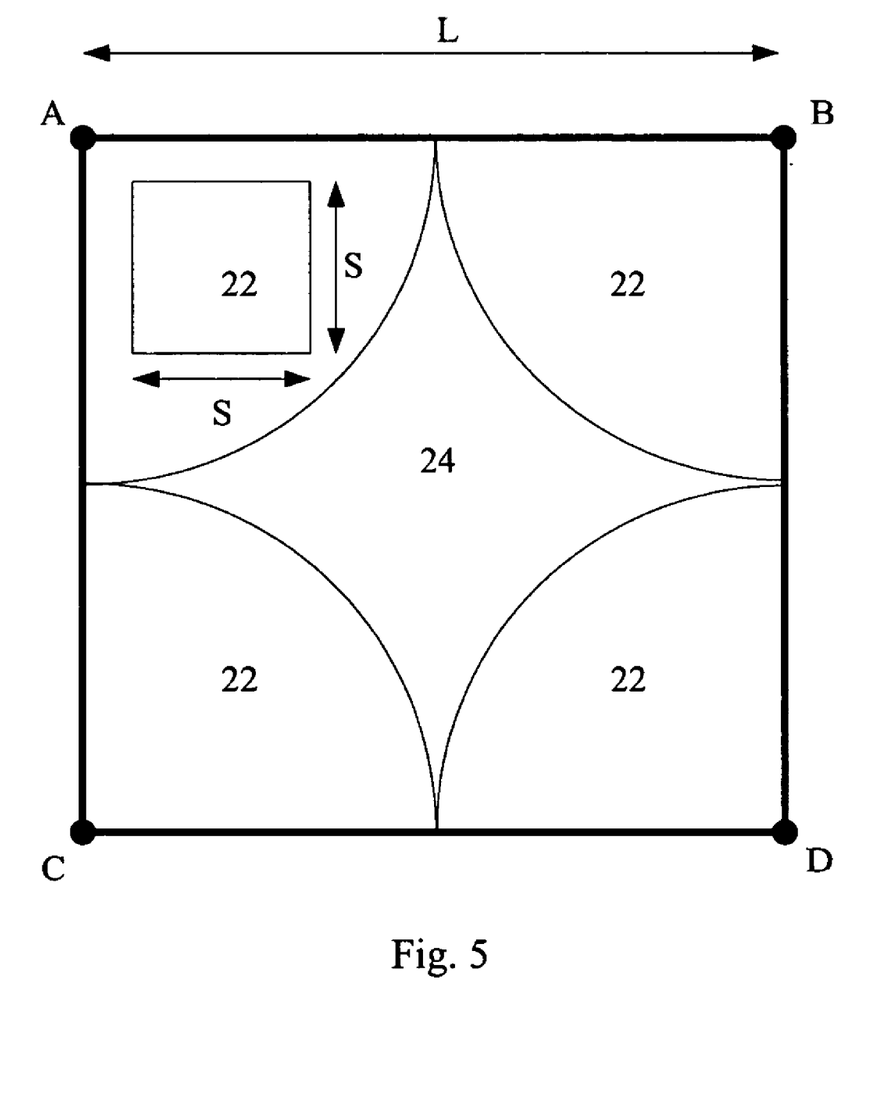
FIG. 5 is a plan view of grains growing between adjacent nucleation sites according to the present invention.

FIG. 5 depicts grains growing from nucleation sites A, B, C, and D arranged as the four corners of a square, wherein the side of the square is L, the distance between nucleation sites. It will be seen that for the area 22, within L/2 of each nucleation site, will be contiguous areas with no more than one grain boundary. Only within area 24 is there any possibility of the formation of more than one grain boundaries. The size of area 22 is:

$$\pi \times (L/2)^2$$

The number of square areas having no dimension greater than L/4, say length S, which can be placed into the area 22 will be $\pi \times (L/2)^2$ divided by the area of the one of these squares:

$$\pi \times (L/2)^2 / (S^2)$$

The size of the entire square enclosed between nucleation sites A, B, C, and D is $L^2$. The number of square areas having no dimension greater than L/4, say length S, which can be placed into the area $L^2$ will be $L^2$ divided by the area of the one of these squares:

$$L^2/S^2$$

The probability that the square areas (which have no dimension greater than L/4, say length S) will have no more than one grain boundary is:

$$\pi/4$$

This calculation assumed the crystal grows in a circular shape. In reality, it may have a different shape. Regardless of the shape of the crystallization front, at the completion of crystallization, area 22 will always be greater than calculated here because of the disappearance of the amorphous region. Thus the chance that a square area with no side larger than L/4 will have no more than one grain boundary will be greater than $\pi/4$.

Since uniformity across substantially the entire seeded area is predictable, placement of the nucleation sites and placement of individual transistors, for example memory cells, need not be coordinated. This makes fabrication of an array of devices simpler and cheaper than if their locations are constrained by seeding locations, or if seeding locations are constrained by the circuit layout.

The anneal that completes crystallization may take place in a single step after seeding is complete, or may be completed in several steps as high-temperature processes are performed during subsequent processing.

A large-grained polysilicon layer with uniform grain boundary distribution formed according to the present invention serves as an advantageous platform for, for example, active regions of TFT devices. A plurality of active devices can be fabricated in the polysilicon layer of the present invention. A TFT array can be fabricated, for example, with sources, drains, and channel regions of the transistors making up the array formed in the large-grained, uniform polysilicon layer of the present invention. The large grains and small number of grain boundaries will improve performance of the devices, while the uniform density of the polysilicon layer will ensure that device parameters, for example threshold voltage, are uniform across the array.

This method provides particular advantage for a TFT memory array, for example one made up of charge storage memory cells. In charge storage memory cells, such as SONOS or floating gate devices, charge is stored in a charge storage layer. The charge storage layer can be either dielectric material, as in a SONOS device, or conductor or semiconductor material, as in a floating gate device. The charge storage layer is separated from the channel region and the gate electrode by dielectric layers. The threshold voltage of the device is influenced by the stored charge. Programmed and erased memory cells are distinguished by their different threshold voltages. Variation of threshold voltage across an array can be minimized by restricting the maximum number of grains possible in the channel because the I-V characteristics of the cells are more uniform. This makes it easier to reliably distinguish erased cells from programmed cells.

The method of the present invention also provides advantage for monolithic three dimensional memory arrays. Monolithic three dimensional memory arrays having rewritable memory cells are described in Lee et al., U.S. patent application Ser. No. 09/927,648, "Dense Arrays and Charge Storage Devices, and Methods for Making Same," filed Aug. 13, 2001; Walker et al., U.S. application Ser. No. 10/335,089, "Method for Fabricating Programmable Memory Array Structures Incorporating Series-Connected Transistor Strings," filed Dec. 31, 2002; and Scheuerlein et al., U.S. application Ser. No. 10/335,078, "Programmable Memory Array Structure Incorporating Series-Connected Transistor Strings and Methods for Fabrication and Operation of Same," filed Dec. 31, 2002, all assigned to the assignee of the present invention and hereby incorporated by reference.

A monolithic three dimensional memory array is one in which multiple memory levels are formed above a single substrate, such as a wafer, with no intervening substrates. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Any of the memory arrays described in the documents incorporated above can be built using a polysilicon layer seeded and crystallized according to the method of the present invention.

A monolithic three dimensional memory array comprising charge storage devices can be fabricated, for example, by forming a first amorphous silicon layer, exposing it to a crystallizing agent at substantially uniform intervals, and annealing a first polysilicon layer according to the description given above, using, for example, silicon nuclei, germanium, or laser energy, and optionally forming a second amorphous layer before the anneal. A plurality of charge storage devices having sources, drains, and channel regions in the first polysilicon layer can be formed as described in any of the incorporated documents. The memory cells formed in the polysilicon form a memory level in a monolithic three dimensional memory array.

The descriptions of formation of monolithic three dimensional memory arrays further describe forming at least a second additional polysilicon layer above the first polysilicon layer to form a second level of memory cells over the first. The second polysilicon layer can be formed using the methods of the present invention. Using spacing of 1 micron in a symmetric pattern, for example, a monolithic three dimensional memory array formed on a wafer, the memory array comprising two polysilicon films formed according to the present invention, one over the other, will thus comprise 1) a first crystallized silicon layer wherein, for a seeded area of the wafer, the area bounded by adjacent nucleation sites encloses no more than five crystal grain boundaries, and 2) a second crystallized silicon layer formed above the first crystallized silicon layer wherein, for a seeded area of the wafer, the area bounded by adjacent nucleation sites encloses no more than five crystal grain boundaries.

The specific values provided in the description of the present invention assume that the first amorphous silicon layer and the second amorphous silicon layer (if used) are undoped. The method of depositing an amorphous layer, introducing symmetrically-distributed crystallizing agents, optionally depositing a second amorphous layer, and inducing grain growth can also be used when the amorphous silicon is doped with phosphorus. Phosphorus is used to create N-type silicon. Phosphorus atoms behave as nucleation inhibitors, so the conditions separating formation of amorphous and of polycrystalline silicon will be changed in known ways according to the amount of dopant. The skilled practitioner will adjust temperature, pressure, and other conditions accordingly.

The method is not relevant to conventionally produced in-situ boron-doped silicon, however. Silicon doped with boron atoms to create P-type silicon will behave differently, as the boron atoms themselves promote nucleation. Conventionally in-situ boron-doped silicon, if deposited at the temperatures and pressures disclosed herein for deposition of undoped amorphous silicon, will be polycrystalline rather than amorphous.

It has been noted that, because the density of grain boundaries is known and uniform across the seeded area, devices can be placed anywhere within that area, without coordinating device location with seeding location. It may be advantageous, however, to include alignment marks in the mask used to create the holes in the mask layer. In this way the same alignment marks can be used when patterning devices, and, if desired, device placement can be coordinated with seed location. Alignment may be continued from one layer to the next. Alignment marks can be used to coordinate the placement of the transistor cells from layer to layer in the vertical direction, which renders process control of uniformity across layers easier.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for crystallizing a polysilicon layer on a wafer, the method comprising:
    forming a first amorphous silicon layer;
    selectively introducing a crystallizing agent on the amorphous layer in a substantially symmetric pattern in two dimensions; and
    annealing the wafer to form the crystallized polysilicon layer, wherein substantially no amorphous silicon remains between silicon grains in the polysilicon layers, wherein the crystallizing agent is silicon nuclei, wherein the step of selectively introducing a crystallizing agent in a substantially symmetric pattern comprises:
    forming a mask layer on the first amorphous silicon layer;
    etching holes in the mask layer, the holes distributed in a substantially symmetric pattern and exposing portions of the first amorphous layer; and
    depositing silicon nuclei on the mask layer and the exposed portions of the first amorphous layer.

2. The method of claim 1 further comprising, before the annealing step, forming a second layer of amorphous silicon on and in contact with the first amorphous silicon layer and the silicon nuclei.

3. The method of claim 1 wherein a plurality of thin film transistors is formed having channel regions formed in the polysilicon layer.

4. The method of claim 3 wherein the thin film transistors are memory cells.

5. The method of claim 4 wherein the memory cells are SONOS devices.

6. The method of claim 4 wherein the memory cells are floating gate devices.

7. The method of claim 4 wherein the memory cells are a portion of a memory level in a monolithic three dimensional memory array.

8. A method for crystallizing a polysilicon layer on a wafer, the method comprising:
    forming a first amorphous silicon layer;
    selectively introducing a crystallizing agent on the amorphous layer in a substantially symmetric pattern in two dimensions; and
    annealing the wafer to form the crystallized polysilicon layer, wherein substantially no amorphous silicon remains between silicon grains in the polysilicon layers, wherein the crystallizing agent is laser energy wherein the step of selectively introducing a crystallizing agent in a substantially symmetric pattern comprises treating the first amorphous layer with a laser at locations distributed in a substantially symmetric pattern.

9. The method of claim 8 wherein the step of selectively introducing a crystallizing agent in a substantially symmetric pattern comprises creating a laser interference pattern, and wherein a plurality of thin film transistors is formed, channel regions of the thin film transistors formed in the polysilicon layer.

10. A method for producing a wafer having a crystallized silicon layer with controlled defect density, the method comprising:
- forming a first layer of amorphous silicon on the wafer;
- selectively introducing a crystallizing agent on the amorphous silicon layer in a substantially symmetric pattern across a seeded area; and
- annealing the amorphous silicon layer, wherein, after the annealing step,
- in the seeded area, an area bounded by adjacent nucleation sites encloses no more than five crystal grain boundaries.

11. The method of claim 10 wherein the symmetric pattern is substantially evenly spaced in two dimensions.

12. The method of claim 10 wherein the crystallizing agent is silicon nuclei.

13. The method of claim 12 further comprising, before the annealing step, forming a second layer of amorphous silicon on and in contact with at least portions of the first amorphous silicon layer.

14. The method of claim 10 wherein the crystallizing agent is germanium.

15. The method of claim 14 further comprising, before the annealing step, forming a second layer of amorphous silicon on and in contact with at least portions of the first amorphous silicon layer.

16. The method of claim 10 wherein the crystallizing agent is laser energy.

17. The method of claim 10 wherein a monolithic three dimensional memory array comprising charge storage devices is fabricated on the wafer, portions of the devices comprising portions of the crystallized silicon layer.

18. A method for controlling grain uniformity on a wafer, the method comprising:
- forming a first layer of amorphous silicon on the wafer;
- selectively introducing a crystallizing agent at substantially uniform intervals across an area of the amorphous silicon layer;
- forming a second layer of amorphous silicon on and in contact with at least portions of the first layer of amorphous silicon; and
- annealing the wafer to convert the amorphous silicon layers to a polysilicon layer wherein the crystallizing agent is silicon nuclei.

19. A method for controlling grain uniformity on a wafer, the method comprising:
- forming a first layer of amorphous silicon on the wafer;
- selectively introducing a crystallizing agent at substantially uniform intervals across an area of the amorphous silicon layer;
- forming a second layer of amorphous silicon on and in contact with at least portions of the first layer of amorphous silicon; and
- annealing the wafer to convert the amorphous silicon layers to a polysilicon layer, wherein the crystallizing agent is laser energy.

20. The method of claim 18 wherein the uniform intervals are substantially evenly spaced in two dimensions.

21. The method of claim 18 wherein a plurality of thin film transistors is formed, having channel regions formed in the polysilicon layer.

22. The method of claim 21 wherein the plurality of thin film transistors form a portion of a monolithic three dimensional memory array.

23. A method for maximizing grain size and controlling density of grain boundaries in crystallized silicon, the method comprising:
- forming a first amorphous silicon layer on a wafer;
- selectively creating nucleation sites at substantially uniform intervals on the first amorphous silicon layer;
- annealing the wafer to convert the amorphous layer to polysilicon; and
- forming a plurality of memory cells in the polysilicon, wherein portions of the cells comprise portions of the polysilicon, and wherein placement of the nucleation sites and placement of individual memory cells is not coordinated.

24. The method of claim 23 wherein the uniform intervals are substantially evenly spaced in two dimensions.

25. The method of claim 23 wherein the step of selectively creating nucleation sites at uniform intervals comprises depositing silicon nuclei.

26. The method of claim 23 wherein the step of selectively creating nucleation sites at uniform intervals comprises depositing germanium.

27. The method of claim 23 wherein the step of selectively creating nucleation sites at uniform intervals comprises exposing the first amorphous silicon layer to laser energy at uniform intervals.

28. The method of claim 23 wherein the plurality of memory cells is a portion of a monolithic three dimensional memory array.

29. A method for controlling grain boundaries in a polysilicon layer, the method comprising:
- forming a first amorphous silicon layer on a wafer;
- forming a mask layer having holes at substantially uniform intervals on and in contact with the first amorphous silicon layer wherein the amorphous silicon layer is exposed in the holes;
- depositing a crystallizing agent on the mask layer and on the first amorphous silicon layer;
- forming a second amorphous silicon layer in contact with at least portions of the first amorphous silicon layer, and
- annealing the wafer, wherein the crystallizing agent is silicon nuclei.

30. The method of claim 29
- wherein conversion of the first amorphous layer to hemispherical grains before formation of the second layer is substantially prevented and
- wherein the first and second amorphous layers are crystallized to form the polysilicon layer after the annealing step.

31. The method of claim 29 further comprising forming a plurality of memory cells in the polysilicon layer, wherein portions of the cells comprise portions of the polysilicon layer.

32. A method for controlling grain density in crystallized silicon, the method comprising:
- forming an amorphous silicon layer on a wafer;
- exposing the amorphous silicon layer to laser energy to create symmetrically distributed nucleation sites; and
- annealing the wafer,
- wherein substantially no amorphous silicon remains between silicon grains after the annealing step is complete.

33. The method of claim 32 wherein the amorphous layer is converted to polysilicon, and further comprising forming a plurality of memory cells, wherein portions of the memory cells comprise portions of the polysilicon.

34. The method of claim 32 wherein the plurality of memory cells comprise portions of a monolithic three dimensional memory array.

35. A method for producing a wafer having a crystallized silicon layer with controlled defect density, the method comprising:
- forming a first layer of amorphous silicon on the wafer;
- selectively introducing a crystallizing agent on the amorphous silicon layer in a substantially symmetric pattern across a seeded area, the seeded area having a first distance between nucleation sites; and
- annealing the amorphous silicon layer, wherein, after the annealing step,
- in the seeded area, a chance that a square area having a side less than about one fourth of the first distance has no more than one grain boundary is greater than about 0.75.

36. The method of claim 35 wherein the symmetric pattern is substantially evenly spaced in two dimensions.

37. The method of claim 35 wherein the crystallizing agent is silicon nuclei.

38. The method of claim 35 further comprising, before the annealing step, forming a second layer of amorphous silicon on and in contact with at least portions of the first amorphous silicon layer.

39. The method of claim 35 wherein the crystallizing agent is germanium.

40. The method of claim 39 further comprising, before the annealing step, forming a second layer of amorphous silicon on and in contact with at least portions of the first amorphous silicon layer.

41. The method of claim 35 wherein the crystallizing agent is laser energy.

42. The method of claim 35 wherein a monolithic three dimensional memory array comprising charge storage devices is fabricated on the wafer, portions of the devices comprising portions of the crystallized silicon layer.

43. A method for controlling grain boundaries in a polysilicon layer, the method comprising:
- forming a first amorphous silicon layer on a wafer;
- forming a mask layer on and in contact with the first amorphous silicon layer;
- etching the mask layer wherein portions of the amorphous silicon layer are exposed;
- depositing silicon nuclei on the mask layer and on the first amorphous silicon layer;
- forming a second amorphous silicon layer in contact with at least portions of the first amorphous silicon layer, and annealing the wafer.

* * * * *

UNITED STATES PATENT AND TRADEMARK OFFICE
CERTIFICATE OF CORRECTION

PATENT NO. : 7,195,992 B2 Page 1 of 1
APPLICATION NO. : 10/681509
DATED : March 27, 2007
INVENTOR(S) : Cleeves It is certified that error appears in the above-identified patent and that said Letters Patent is hereby corrected as shown below:

Col. 15, line 19: after "claim" and before "further" delete "35" and substitute -- 37--

Signed and Sealed this

Twentieth Day of November, 2007

JON W. DUDAS
*Director of the United States Patent and Trademark Office*